(12) United States Patent
Ontalus

(10) Patent No.: US 11,404,563 B2
(45) Date of Patent: Aug. 2, 2022

(54) INSULATED-GATE BIPOLAR TRANSISTOR WITH ENHANCED FREQUENCY RESPONSE, AND RELATED METHODS

(71) Applicant: GLOBALFOUNDRIES U.S. Inc., Santa Clara, CA (US)

(72) Inventor: Viorel C. Ontalus, Hartford, CT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 118 days.

(21) Appl. No.: 16/728,172

(22) Filed: Dec. 27, 2019

(65) Prior Publication Data

US 2021/0202722 A1 Jul. 1, 2021

(51) Int. Cl.

| | | |
|---|---|---|
| H01L 29/76 | (2006.01) | |
| H01L 29/739 | (2006.01) | |
| H01L 29/165 | (2006.01) | |
| H01L 29/06 | (2006.01) | |
| H01L 21/02 | (2006.01) | |
| H01L 29/66 | (2006.01) | |
| H01L 29/10 | (2006.01) | |

(52) U.S. Cl.
CPC .... *H01L 29/7395* (2013.01); *H01L 21/02532* (2013.01); *H01L 29/0626* (2013.01); *H01L 29/1095* (2013.01); *H01L 29/165* (2013.01); *H01L 29/66333* (2013.01); H01L 29/7397 (2013.01)

(58) Field of Classification Search
None
See application file for complete search history.

(56) References Cited

U.S. PATENT DOCUMENTS

| | | | |
|---|---|---|---|
| 6,239,463 B1 | 5/2001 | Williams et al. | |
| 8,017,978 B2 | 9/2011 | Lidow et al. | |
| 8,963,225 B2 | 2/2015 | Vincent et al. | |
| 2006/0292805 A1* | 12/2006 | Kawamura | H01L 29/7397 257/E29.198 |
| 2008/0128749 A1* | 6/2008 | Enicks | H01L 29/7325 438/312 |
| 2008/0237572 A1* | 10/2008 | Chui | H01L 29/7782 257/14 |
| 2010/0213477 A1* | 8/2010 | Xu | H01L 33/0041 257/E33.013 |
| 2020/0058506 A1* | 2/2020 | Nakamura | H01L 21/26506 |

* cited by examiner

*Primary Examiner* — Ali Naraghi
(74) *Attorney, Agent, or Firm* — Francois Pagette; Hoffman Warnick LLC

(57) ABSTRACT

Embodiments of the disclosure provide an insulated-gate bipolar transistor (IGBT), including: a substrate with a first type of doping; a drift region including a first semiconductor material and a second semiconductor material having dissimilar band gaps, the drift region having a second type of doping; and a base region with the first type of doping, wherein the drift region is disposed between the substrate and the base region; wherein a stoichiometry ratio of the first and second semiconductor materials of the drift region varies as a function of distance within the drift region to provide a built-in electric field via band gap modulation. The built-in electric field reduces a band gap barrier for minority charge carriers and increases a drift velocity of the minority charge carriers in the drift region, increasing a frequency response of the IGBT.

14 Claims, 9 Drawing Sheets

US 11,404,563 B2

INSULATED-GATE BIPOLAR TRANSISTOR WITH ENHANCED FREQUENCY RESPONSE, AND RELATED METHODS

BACKGROUND

The present disclosure relates to high voltage semiconductor devices, and more specifically, to an insulated-gate bipolar transistor (IGBT) with an enhanced frequency response.

An insulated-gate bipolar transistor (IGBT) combines the insulated gate technology of the MOSFET with the output performance characteristics of a conventional bipolar transistor. To this extent, an IGBT generally has the switching and conduction characteristics of a bipolar transistor but is voltage-controlled like a MOSFET. IGBTs are often used in power electronics applications, such as inverters, converters, and power supplies, were the demands of the solid state switching device are not fully met by power bipolar transistors and power MOSFETs.

SUMMARY

A first aspect of the disclosure is directed to an insulated-gate bipolar transistor (IGBT), including: a substrate with a first type of doping; a drift region including a first semiconductor material and a second semiconductor material having dissimilar band gaps, the drift region having a second type of doping; and a base region with the first type of doping, wherein the drift region is disposed between the substrate and the base region; wherein a stoichiometry ratio of the first and second semiconductor materials of the drift region varies as a function of distance within the drift region to provide a built-in electric field via band gap modulation.

A second aspect of the disclosure includes a method for forming an insulated-gate bipolar transistor (IGBT), including: forming a drift region of the IGBT using a combination of a first semiconductor material and a second semiconductor material having dissimilar band gaps; and varying a stoichiometry ratio of the first and second semiconductor materials as a function of distance within the drift region to provide a built-in electric field via band gap modulation.

A third aspect of the disclosure provides a insulated-gate bipolar transistor (IGBT), including: a drift region including a first semiconductor material and a second semiconductor material having dissimilar band gaps, where the first semiconductor material includes silicon (Si) and the second semiconductor material includes germanium (Ge); wherein a stoichiometry ratio of the Si and Ge varies as a function of distance within the drift region to provide a built-in electric field via band gap modulation for reducing a band gap barrier to minority charge carriers within the drift region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

Figure 2:
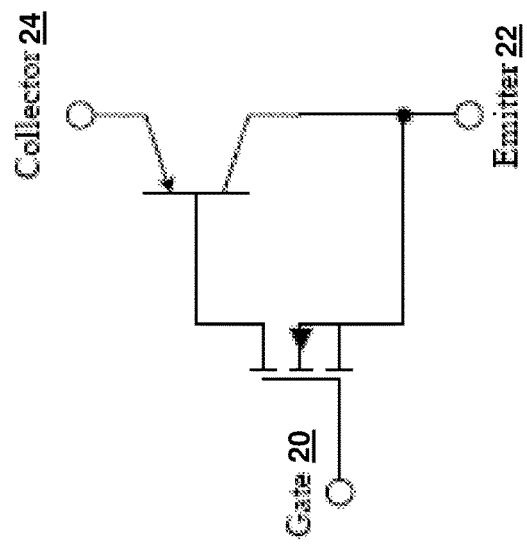
FIG. 2 depicts a simplified equivalent circuit of the IGBT depicted in FIG. 1 according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Figure 1:
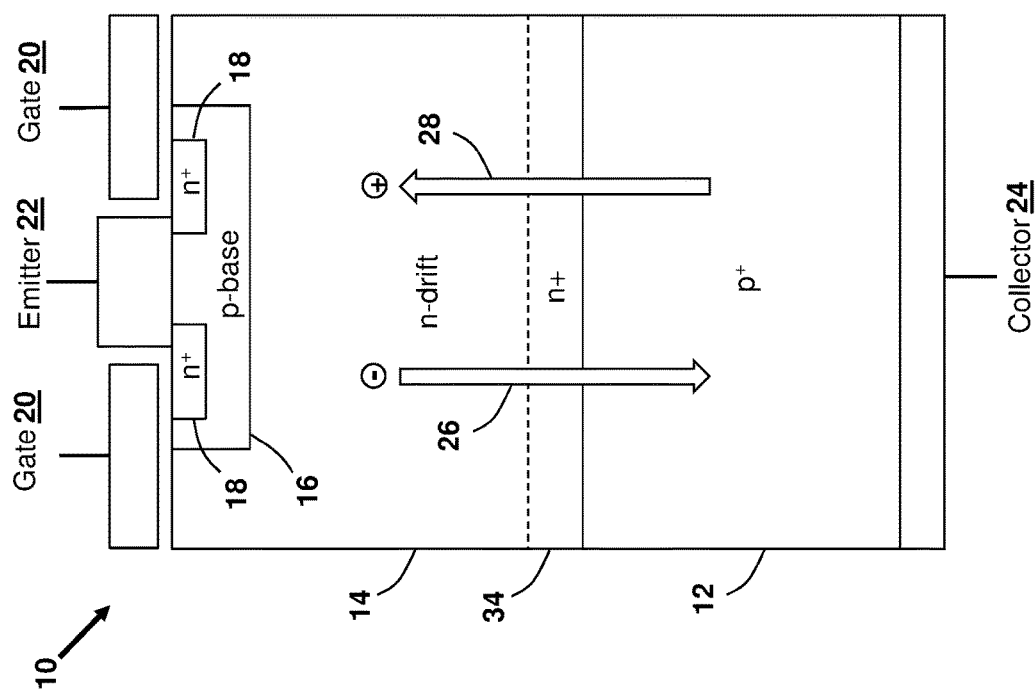
FIG. 1 depicts a cross-sectional view of an insulated-gate bipolar transistor (IGBT) according to embodiments of the disclosure.

FIG. 1 depicts a cross-sectional view of an n-channel insulated-gate bipolar transistor (IGBT) 10 according to embodiments of the disclosure. The IGBT 10 may include a $p^+$-type substrate 12, an n-type drift region 14 formed over the $p^+$-type substrate 12, a p-type base region 16 formed in the n-type drift region 14, and n+-type regions 18 formed within the p-type base region 16. In some cases, an optional buffer layer (e.g., an $n^+$-type buffer layer 34) may be formed in the IGBT 10 between the $p^+$-type substrate 12 and the n-type drift region 14. Such an $n^+$-type buffer layer 34 may, for example, trap and facilitate the recombination of holes during turn-off of the IGBT 10 and/or provide other functionality.

A positive voltage on the gate 20 of the IGBT 10 causes electrons to be drawn toward the gate 20 in the p-type body region 16. If the voltage is at or above the threshold voltage of the IGBT 10, enough electrons are drawn toward the gate 20 to form a conductive channel across the p-type base region 16, allowing electrons to flow from the emitter 22 to the collector 24 as generally indicated by arrow 26. This flow of electrons draws holes from the $p^+$-type substrate 12 into the n-type drift region 14 toward the emitter 24 as generally indicated by arrow 28. FIG. 2 depicts a simplified equivalent circuit of the IGBT 10 depicted in FIG. 1 according to embodiments of the disclosure.

The IGBT 10 is turned off by reducing the voltage on the gate 20 below a threshold voltage (e.g., by applying a zero or negative voltage on the gate 20). The pn junction between the p-type base region 16 and the n-type drift region 14 is thus reverse-biased, interrupting the injection of holes from the $p^+$-type substrate 12 to the n-type drift region 14. At turn-off, current does not stop immediately, but it continues to flow in the IGBT 10 as the holes in the n-type drift region 14 drift out of the n-type drift region 14 toward the p-type base region 16 (or recombine).

Figure 3:
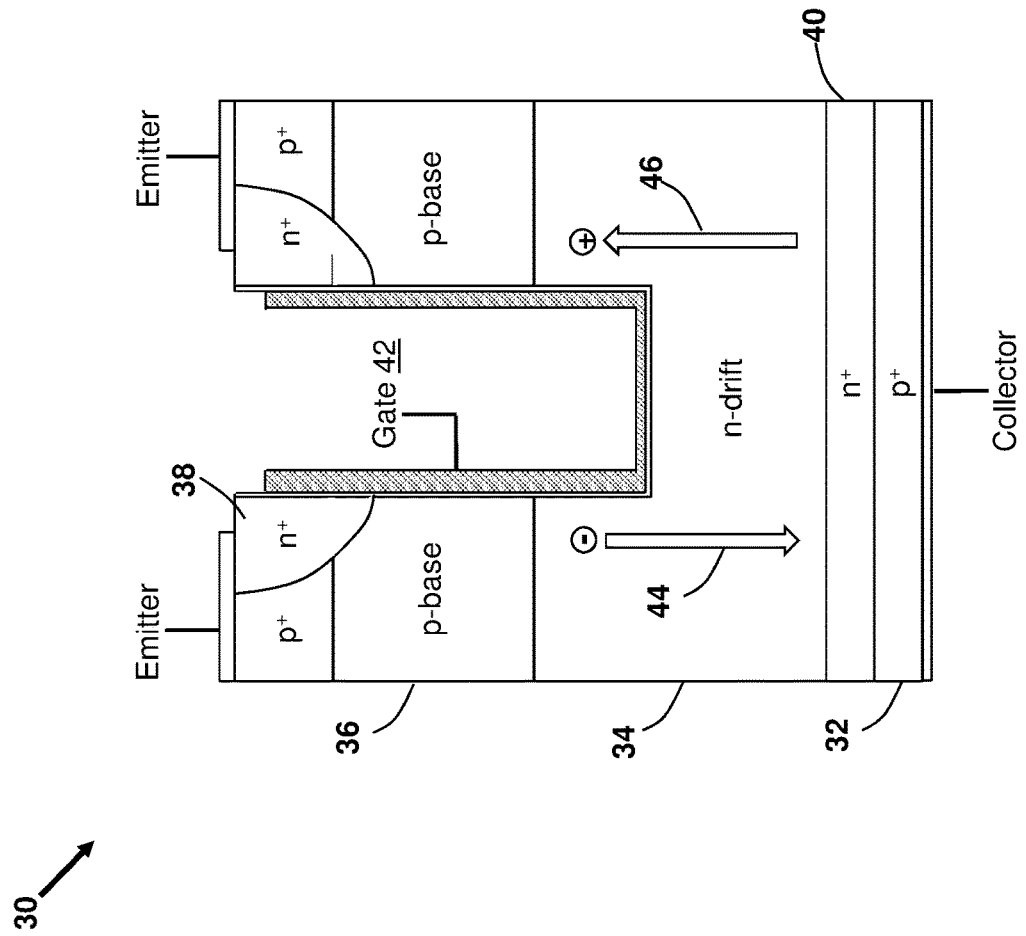
FIG. 3 depicts a cross-sectional view of an IGBT with a trench-gate structure according to embodiments of the disclosure

FIG. 3 depicts a cross-sectional view of another type of n-channel insulated-gate bipolar transistor (IGBT) 30 according to embodiments of the disclosure. Similar to the IGBT 10, the IGBT 30 may include a $p^+$-type substrate 32, an n-type drift region 34 formed over the p⁺-type substrate 32, a p-type base region 36 formed above the n-type drift region 34, and n+-type regions 38 formed within the p-type base region 36. An n⁺-type buffer layer 40 may be provided in the IGBT 30 between the p⁺-type region 32 and the n-type drift region 34. Unlike the IGBT 10, the IGBT 30 includes a gate 42 having a trench structure. A positive voltage applied to the gate 42 results in a flow of electrons and holes as generally indicated by arrows 44, 46.

In general, IGBTs have a long transient due to the slow movement (drift) of minority charge carriers (e.g., holes) in the drift region. This has a negative effect on the frequency response (e.g., switching speed) of the IGBT. According to embodiments of the disclosure, however, the IGBT 10 includes an n-type drift region 14 with a band gap variation at one or more transitions between regions of opposite doping. Such a band gap variation creates a built-in electric field via band gap modulation that increases the drift velocity of minority charge carriers in the n-type drift region 14 and reduces the band gap barrier (e.g., built-in potential) for minority charge carriers exiting the n-type drift region 14. Advantageously, this increases the rate at which the minority charge carriers are swept through and out of the n-type drift region 14, improving the frequency response and reducing the power loss of the IGBT 10.

The strength of a built-in quasi-electric field in a semiconductor device is dependent upon the band gap difference across a region. For example, the quasi-electric field ε for a constant gradient of band gap variation over a distance D between points x and y is given by the deltas in the band gaps Eg at points x and y:

$$\varepsilon_{yx} = (\Delta Eg_y - \Delta Eg_x)/D_{yx}.$$

To this extent, according to embodiments of the disclosure, a band gap variation and a corresponding built-in electric field may be provided via band gap modulation by forming the n-type drift region 14 using a combination of different semiconductor materials having dissimilar band gaps, where a concentration of one or more of the semiconductor materials is varied within the n-type drift region 14 at one or more transitions between regions of opposite doping. Advantageously, the drift velocity of minority charge carriers in the n-type drift region 14 can be selectively controlled (e.g., as a function of application/customer requirements) by appropriate selection of the semiconductor materials and concentrations thereof. The semiconductor materials may include, for example, silicon (Si) and germanium (Ge), where Ge has a smaller band gap than Si. Other suitable semiconductor materials may include, for example, silicon-carbide (SiC) and germanium-carbide (GeC), SiC and aluminum (Al), or other combinations of semiconductor materials having different band gaps.

Figure 4:
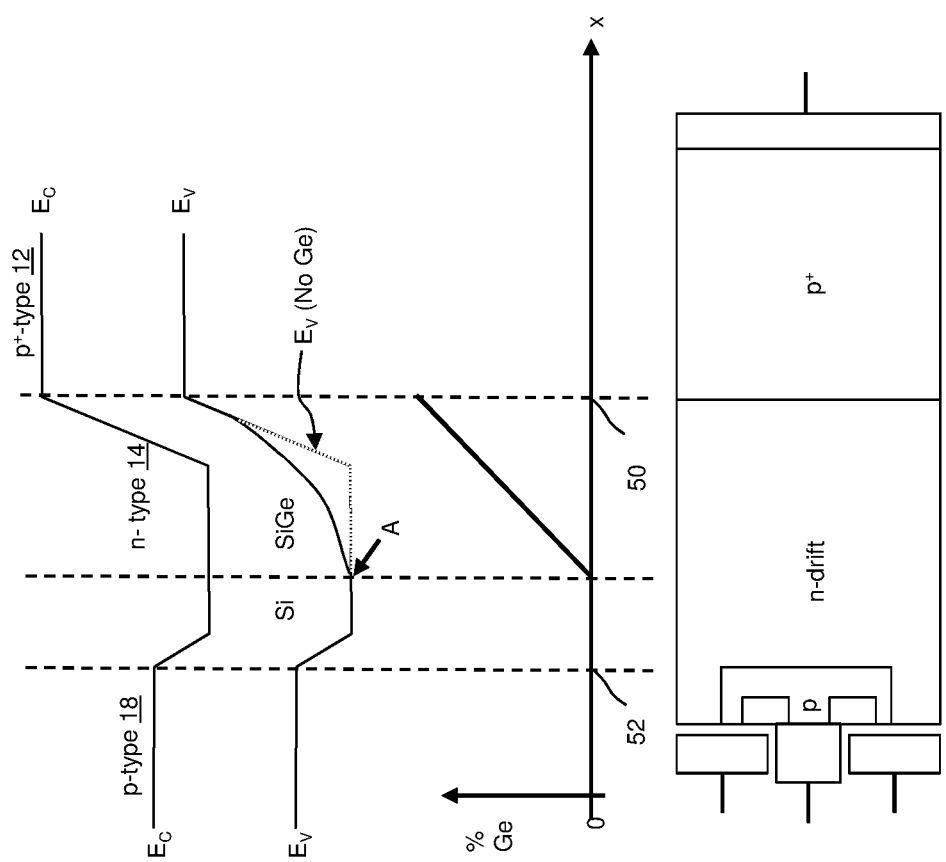
FIGS. 4-6 depict partial band diagrams of an IGBT according to embodiments of the disclosure.
Figure 5:
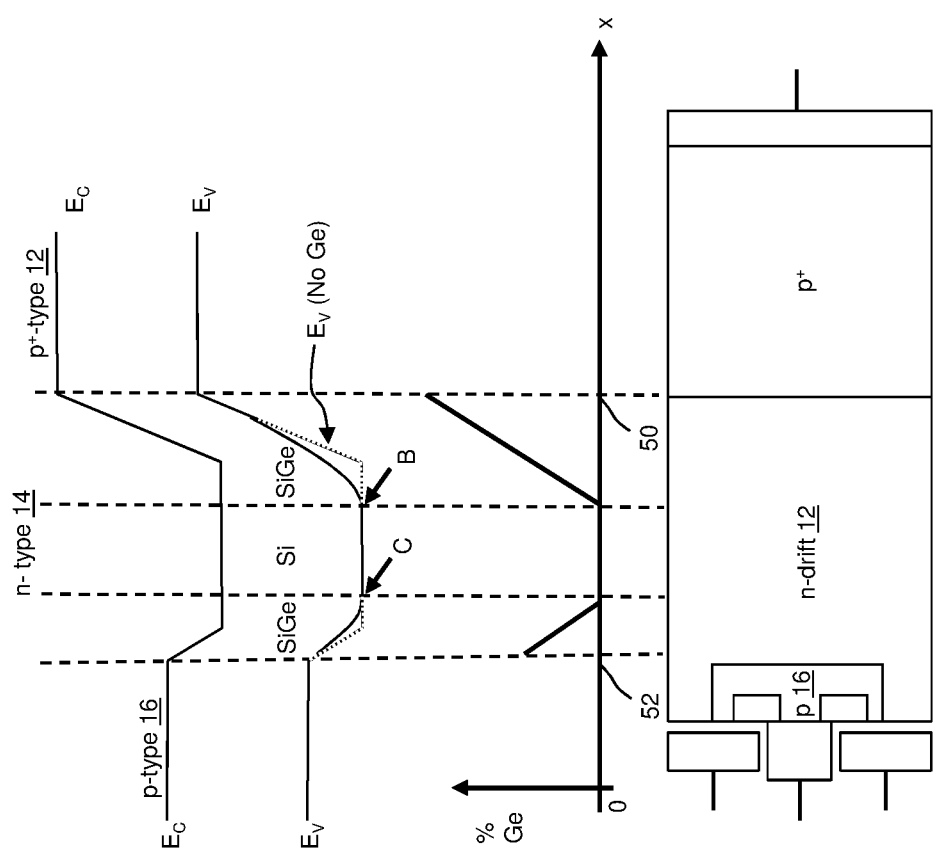
Figure 6:
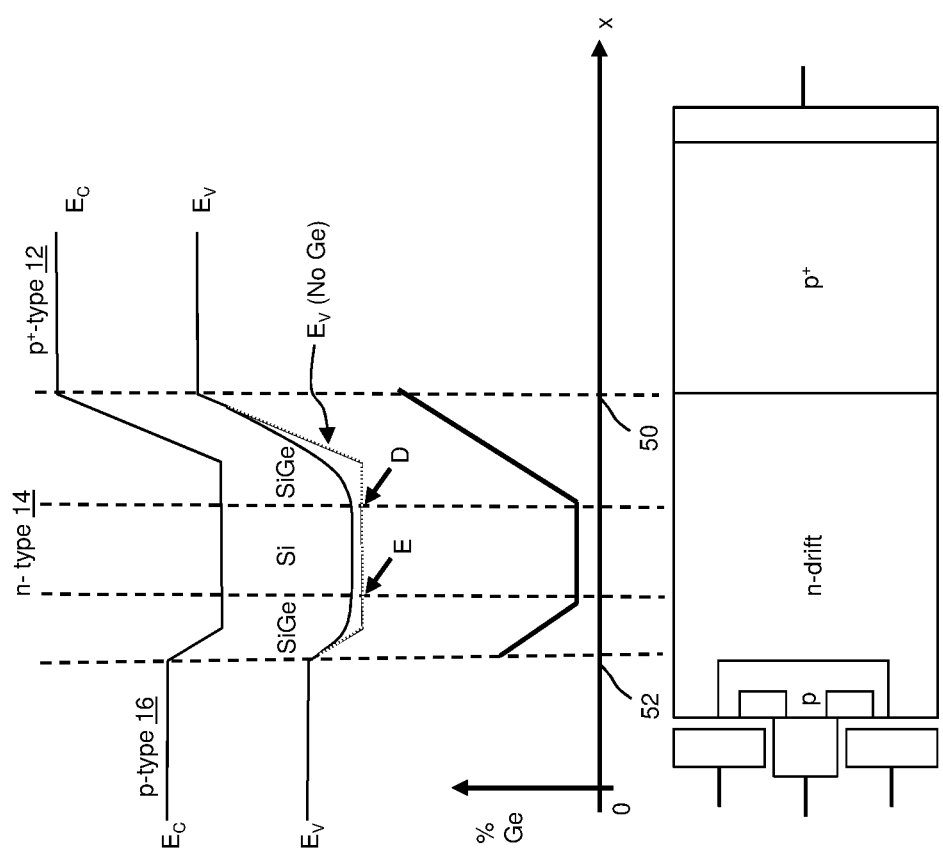

FIGS. 4-6 depict partial band diagrams for an IGBT 10 in which at least a portion of the n-type drift region 14 is formed using SiGe. FIGS. 4-6 also depict the percentage of Ge in the SiGe n-type drift region 14 and the resultant band gap variation.

In FIG. 4, the percentage of Ge increases in the n-type drift region 14 toward the np junction 50 formed between the n-type drift region 14 and the pt-type substrate 12. In particular, the percentage of Ge increases from zero at a point A in the n-type drift region 14 to a higher percentage at the np junction 50. From point A to the pn junction 52 formed between the n-type drift region 14 and the p-type base region 16, the n-type drift region 14 includes no Ge.

The resultant band gap variation from point A to the np junction 50 creates a built-in electric field that increases the velocity of minority charge carriers in the n-type drift region 14. In addition, the built-in electric field reduces the band gap between the valence energy band $E_v$ and the conduction energy band $E_c$, reducing the built-in potential $V_{bi}$ for minority charge carriers at the np junction 50, from the n-type drift region 14 to the p⁺-type substrate 12. In FIG. 4 (and also in FIGS. 5-9), the dotted line labeled "Ev (No Ge)" indicates the valence energy band $E_v$ without the inclusion of Ge. There is no band gap variation in the area of the n-type drift region 14 from point A to the pn junction 52 that includes only Si.

In FIG. 5, the percentage of Ge increases from a first point B in the n-type drift region 14 toward the np junction 50 formed between the n-type drift region 14 and the p⁺-type substrate 12. In addition, the percentage of Ge increases from a second point C in the n-type drift region 14 toward the pn junction 52 formed between the p-type base region 16 and the n-type drift region 14. From point B to point C, the n-type drift region 14 includes no Ge.

The resultant band gap variation from point A to the np junction 50 creates a built-in electric field that increases the velocity of minority charge carriers in the n-type drift region 14. In addition, as in FIG. 4, the built-in electric field reduces the band gap between the valence energy band $E_V$ (dotted line) and the conduction energy band $E_C$, reducing the built-in potential $V_{bi}$ for minority charge carriers at the np junction 50, from the n-type drift region 14 to the p⁺-type substrate 12.

Unlike in FIG. 4, an electric field is present in the area of the n-type drift region 14 from point C to the pn junction 52 due to the band gap variation in that area. The electric field and corresponding reduction in the band gap adjacent the pn junction 52 increases the injection rate of minority charge carriers into the n-type drift region 14. There is no band gap variation in the area of the n-type drift region 14 from point B to point C that includes only Si.

In FIG. 6, the percentage of Ge increases from a first point D in the n-type drift region 14 toward the np junction 50 formed between the n-type drift region 14 and the p⁺-type substrate 12. In addition, the percentage of Ge increases from a second point E in the n-type drift region 14 toward the pn junction 52 formed between the p-type base region 16 and the n-type drift region 14. From point D to point E, the n-type drift region 14 includes a percentage of Ge greater than zero. The resultant band gap throughout the n-type drift region 14 creates a built-in electric field that increases the velocity of minority charge carriers in the n-type drift region 14 and reduces the built-in potential $V_{bi}$ for minority charge carriers at the np junction 50, from the n-type drift region 14 to the p⁺-type substrate 12. Further, the electric field and corresponding reduction in the band gap adjacent the pn junction 52 increases the injection rate of minority charge carriers into the n-type drift region 14.

Figure 7:
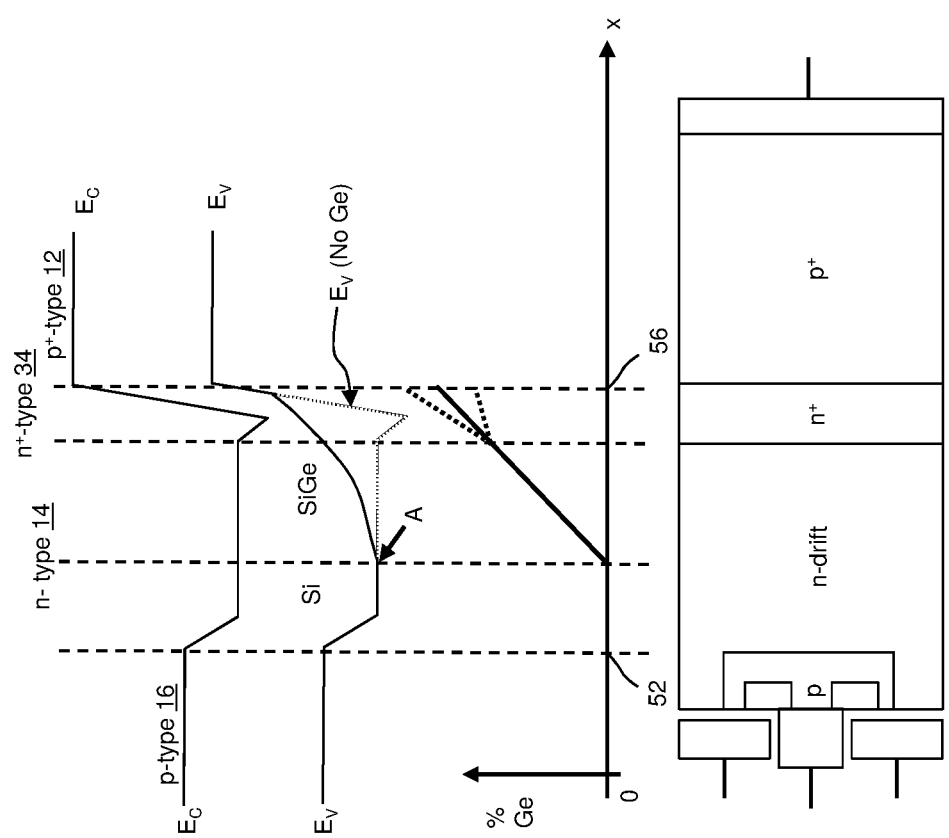
FIGS. 7-9 depict partial band diagrams of an IGBT according to additional embodiments of the disclosure.
Figure 8:
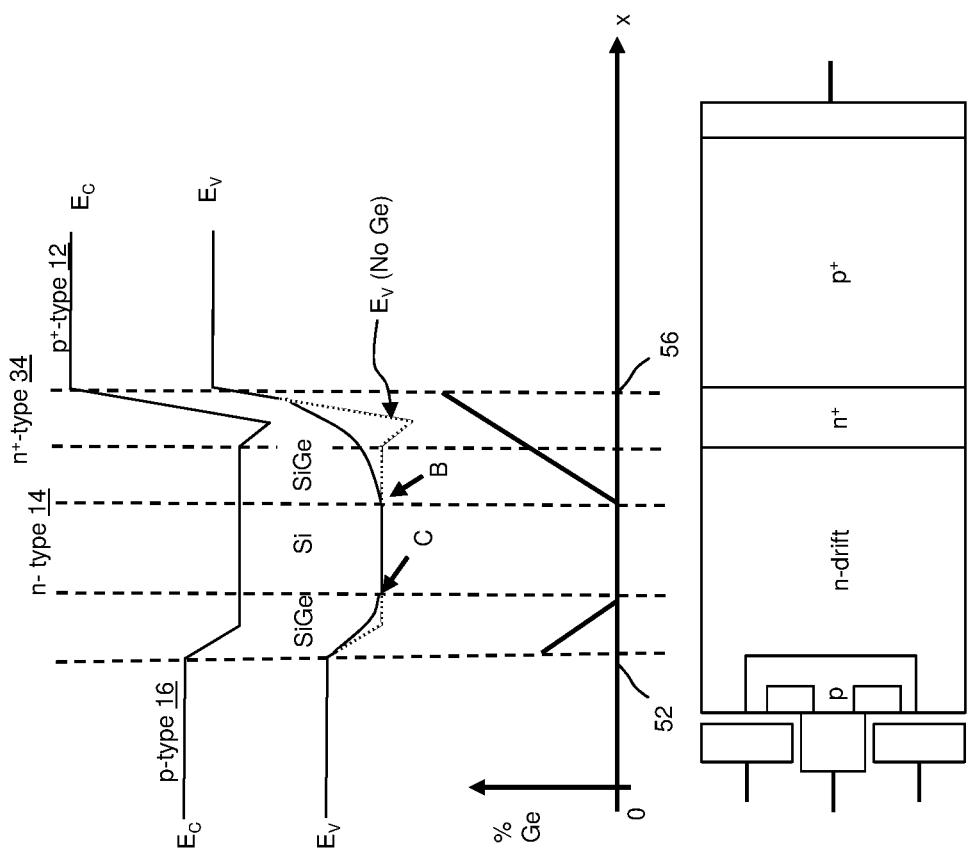
Figure 9:
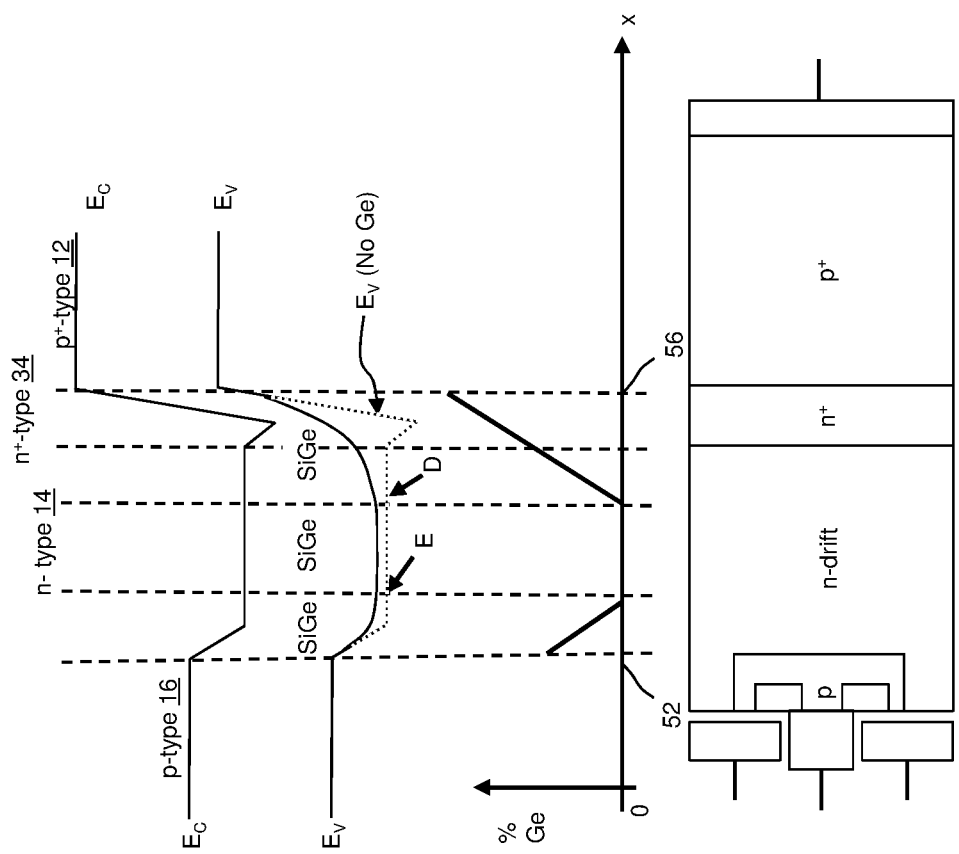

FIGS. 7-9 depict partial band diagrams for an IGBT 10 with an n⁺-type buffer layer 34, in which at least a portion of the n-type drift region 14 and the n⁺-type buffer layer 34 are formed using SiGe. FIGS. 7-9 also depict the percentage of Ge in the SiGe n-type drift region 14 and n⁺-type buffer layer 34 and the resultant band gap variation.

In FIG. 7, the percentage of Ge increases from zero at a point A in the n-type drift region 14 to a higher percentage at the np junction 56 formed between the n⁺-type region 34 and the p⁺-type substrate 12. From point A to the pn junction 52, formed between the n-type drift region 14 and the p-type base region 16, the n-type drift region 14 includes no Ge. The resultant band gap variation from point A to the np junction 56 creates a built-in electric field that increases the velocity of minority charge carriers in the n-type drift region 14 and the n+-type region 34. In addition, the built-in electric field reduces the band gap between the valence energy band $E_V$ (dotted line) and the conduction energy band $E_C$, reducing the built-in potential $V_{bi}$ for minority charge carriers at the np junction 56, from the n-type drift region 14 to the p+-type substrate 12. There is no band gap variation in the area of the n-type drift region 14 from point A to the pn junction 52 that includes only Si.

In FIG. 7, the percentage of Ge is shown as increasing from point A in the n-type drift region 14 to a higher level at the np junction 56 formed between the n+-type region 34 and the p+-type substrate 12. However, this may not provide the desired shift in the valence energy band $E_v$ in the n+-type region 34 (e.g., due to the doping in the n+-type region 34). To this extent, the percentage of Ge in the n+-type region 34 may be varied (e.g., increased) at a higher or lower rate compared to the n-type drift region 14 as shown in FIG. 7. A similar Ge profile may also be provided in FIGS. 8 and 9.

In FIG. 8, the percentage of Ge increases from a first point B in the n-type drift region 14 toward the np junction 56. In addition, the percentage of Ge increases from a second point C in the n-type drift region 14 toward the pn junction 52. From point B to point C, the n-type drift region 14 includes no Ge. The resultant band gap variation from point B to the np junction 56 creates a built-in electric field that increases the velocity of minority charge carriers in the n-type drift region 14 and the n+-type region 34. In addition, the built-in electric field reduces the band gap between the valence energy band $E_V$ (dotted line) and the conduction energy band $E_C$, reducing the built-in potential $V_{bi}$ for minority charge carriers at the np junction 56, from the n-type drift region 14 to the p+-type substrate 12.

An electric field is also present in the area of the n-type drift region 14 from point C to the pn junction 52 due to the band gap variation in this area. The electric field and corresponding reduction in the band gap adjacent the pn junction 52 increases the injection rate of minority charge carriers into the n-type drift region 14. There is no band gap variation in the area of the n-type drift region 14 from point B to point C that includes only Si.

In FIG. 9, the percentage of Ge increases from a first point D in the n-type drift region 14 toward the np junction 56. In addition, the percentage of Ge increases from a second point E in the n-type drift region 14 toward the pn junction 52. From point D to point E, the n-type drift region 14 includes a percentage of Ge greater than zero. The resultant band gap throughout the n-type drift region 14 and n+-type region 34 creates a built-in electric field that increases the velocity of minority charge carriers in those regions and reduces the built-in potential $V_{bi}$ for minority charge carriers at the np junction 56, from the n-type drift region 14 to the p+-type substrate 12. Further, the electric field and corresponding reduction in the band gap adjacent the pn junction 52 increases the injection rate of minority charge carriers into the n-type drift region 14.

The examples depicted in FIGS. 4-9 are not meant to be limiting. Although described above in conjunction with n-channel IGBTs 10, 30 it should be apparent that the techniques described herein can also be applied to other types of IGBTs, including p-channel IGBTs with a p-type drift region. In general, according to embodiments, the band gap variation, corresponding built-in electric field, and drift velocity of minority charge carriers in an IGBT may be selectively tuned by varying the concentration of different semiconductor materials having dissimilar band gaps in a drift region of the IGBT at one or more transitions between regions of opposite doping.

In certain applications (e.g., high power), semiconductor materials with a larger band gap than Si may be used (e.g., SiC and GeC). For example, according to embodiments, a drift region in an IGBT may be formed using a combination of SiC and GeC. In particular, a band gap variation and a corresponding built-in electric field may be provided in a drift region of an IGBT (e.g., IGBT 10, 30) by forming the drift region (e.g., n-type drift region 14) using a combination of SiC and GeC, where a concentration of GeC is varied within the drift region at one or more transitions between regions of opposite doping. Another option includes using Al to modulate the band gap in SiC. Many other combinations of semiconductor materials having different band gaps may also be used to form an IGBT according to embodiments.

According to embodiments, a band gap variation and a corresponding built-in electric field may be provided by forming a drift region (e.g., n-type drift region 14) of an IGBT (e.g., IGBT 10, 30) using a combination of different semiconductor materials having dissimilar band gaps, where a concentration of one or more of the semiconductor materials is varied within the drift region at one or more transitions between regions of opposite doping (e.g., at np or pn junctions). With the exception of the drift region, the IGBT may be formed using known semiconductor processing techniques.

Figure 10:
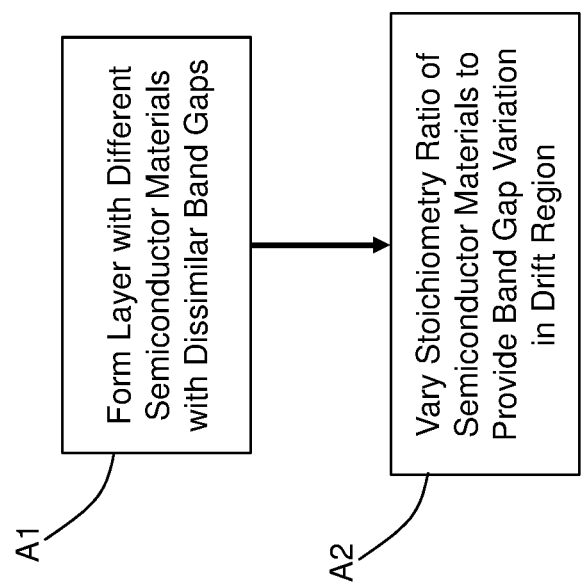
FIG. 10 depicts a flow diagram of a process for forming a drift region of an IGBT according to embodiments.

One example process for forming the n-type drift region 14 of the IGBT 10 is depicted in the flow diagram illustrated in FIG. 10. At process A1 in FIG. 10, after selecting a plurality of different semiconductor materials (e.g., Si and Ge) with dissimilar band gaps to provide a desired level of performance (e.g., frequency response, power loss, etc.), a layer including the semiconductor materials is grown (e.g., epitaxially) on the p+-type substrate 12 (or n+-type buffer layer 34, if present). At process A2, the stoichiometry ratio of the semiconductor materials is varied as a function of distance as the epitaxial film is grown to provide a desired band gap variation (and corresponding built-in electric field) within the layer.

Non-limiting examples of the variation of the stoichiometry ratio of first and second semiconductor materials as a function of distance are presented below. As depicted in FIGS. 4 and 7, for example, the drift layer may be formed using a combination of a first semiconductor material (Si) and a second semiconductor material (Ge), where the percentage of the second semiconductor material increases from zero at a point within the drift region to a higher percentage at a transition between regions of opposite doping (e.g., np junction 50, 56). As another example, as depicted in FIGS. 5 and 8, the drift layer may be formed using a combination of a first semiconductor material and a second semiconductor material, where the percentage of the second semiconductor material increases from zero at a first point within the drift region to a higher percentage at a first transition between regions of opposite doping (e.g., np junction 50, 56). In addition, the percentage of the second semiconductor material increases from zero at a second point within the drift region to a higher percentage at a second transition between regions of opposite doping (e.g., pn junction 52). Between the first and second points in the drift region, none of the second semiconductor material is present. In yet another example, as depicted in FIGS. 6 and 9, the drift layer may be formed using a combination of a first semiconductor material and a second semiconductor material, where the percentage of the second semiconductor material increases from a first, non-zero percentage at a first point within the drift region to a higher percentage at a first transition between regions of opposite doping (e.g., np junction 50, 56). In addition, the percentage of the second semiconductor material increases from a second non-zero percentage (which may be the same or different than the first non-zero percentage) at a second point within the drift region to a higher percentage at a second transition between regions of opposite doping (e.g., pn junction 52). A non-zero percentage of the second semiconductor material is present between the first and second points in the drift region. In each of these examples, the increase in the percentage of the second semiconductor material may be linear or non-linear within the drift region.

Epitaxy (e.g., molecular-beam epitaxy) is only one of many possible band gap engineering techniques that may be used to provide a band gap variation in the drift region of an IGBT. For example, stress modulation may be used to provide (or enhance) band gap variation(s) in the drift region of an IGBT.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An insulated-gate bipolar transistor (IGBT), comprising:
   a substrate with a first type of doping;
   a drift region formed of a compound semiconductor including a first semiconductor material and a second semiconductor material having dissimilar band gaps, the drift region having a second type of doping; and
   a base region with the first type of doping, wherein the drift region is disposed between the substrate and the base region;
   wherein a stoichiometry ratio of the first and second semiconductor materials of the compound semiconductor in the drift region varies as a function of distance within the drift region to provide a built-in electric field via band gap modulation, and
   wherein a percentage of the second semiconductor material in the compound semiconductor increases from a first value at a point within the drift region to a higher value at a transition between the drift region and the substrate, and wherein the percentage of the second semiconductor material in the compound semiconductor increases from a second value within the drift region to a higher value at a transition between the drift region and the base region.

2. The IGBT according to claim 1, wherein the built-in electric field reduces a band gap barrier for minority charge carriers and increases a drift velocity of the minority charge carriers in the drift region.

3. The IGBT according to claim 1, further including a buffer layer with the second type of doping formed between the drift region and the substrate.

4. The IGBT according to claim 1, wherein the first value and the second value are each greater than zero.

5. The IGBT according to claim 1, wherein the first and second semiconductor materials comprise silicon (Si) and germanium (Ge), silicon-carbide (SiC) and germanium-carbide (GeC), or SiC and aluminum (Al).

6. An insulated-gate bipolar transistor (IGBT), comprising:
   a drift region including a first semiconductor material and a second semiconductor material having dissimilar band gaps, where the first semiconductor material includes silicon (Si) and the second semiconductor material includes germanium (Ge);
   wherein a stoichiometry ratio of the Si and Ge varies as a function of distance within the drift region to provide a built-in electric field via band gap modulation for reducing a band gap barrier to minority charge carriers within the drift region,
   wherein a percentage of Ge increases from a first value at a point within the drift region to a higher value at a transition between the drift region and a first region of opposite doping, and wherein the percentage of Ge increases from a second value within the drift region to a higher value at a transition between the drift region and a second region of opposite doping.

7. The IGBT according to claim 6, wherein the built-in electric field increases a drift velocity of the minority charge carriers in the drift region.

8. The IGBT according to claim 6, wherein the first value and the second value are each equal to or greater than zero.

9. An insulated-gate bipolar transistor (IGBT), comprising:
   a substrate with a first type of doping;

a drift region formed of a first region of a compound semiconductor, a second region of the compound semiconductor, and a first semiconductor material disposed between the first region of the compound semiconductor and the second region of the compound semiconductor, wherein the first region of the compound semiconductor and the second region of the compound semiconductor include the first semiconductor material and a second semiconductor material, and wherein the first semiconductor material and the second semiconductor material have dissimilar band gaps, the drift region having a second type of doping; and a base region with the first type of doping, wherein the drift region is disposed between the substrate and the base region, wherein a stoichiometry ratio of the first and second semiconductor materials in the first region of the compound semiconductor and in the second region of the compound semiconductor varies as a function of distance within the drift region to provide a built-in electric field via band gap modulation.

10. The IGBT according to claim 9, wherein a percentage of the second semiconductor material in the first region of the compound semiconductor increases from a first value at a point within the drift region to a higher value at a transition between the drift region and the substrate, and wherein the percentage of the second semiconductor material in the second region of the compound semiconductor increases from a second value within the drift region to a higher value at a transition between the drift region and the base region.

11. The IGBT according to claim 9, wherein the built-in electric field reduces a band gap barrier for minority charge carriers and increases a drift velocity of the minority charge carriers in the drift region.

12. The IGBT according to claim 9, further including a buffer layer with the second type of doping formed between the drift region and the substrate.

13. The IGBT according to claim 9, wherein the first value and the second value are each equal to zero.

14. The IGBT according to claim 9, wherein the first and second semiconductor materials comprise silicon (Si) and germanium (Ge), silicon-carbide (SiC) and germanium-carbide (GeC), or SiC and aluminum (Al).

* * * * *